(12) United States Patent
Wang et al.

(10) Patent No.: US 9,786,539 B2
(45) Date of Patent: Oct. 10, 2017

(54) WAFER CHUCK

(71) Applicant: Taiwan Semiconductor Manufacturing Co., Ltd, Hsin-Chu (TW)

(72) Inventors: Yeh-Chieh Wang, Hsinchu (TW); Jiun-Rong Pai, Jhubei (TW); Hsu-Shui Liu, Pingjhen (TW); Cheng-Lung Lee, Hsinchu (TW); Kuang-Chung Liou, Taichung (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 638 days.

(21) Appl. No.: 14/332,643

(22) Filed: Jul. 16, 2014

(65) Prior Publication Data

US 2016/0020128 A1   Jan. 21, 2016

(51) Int. Cl.
*H01T 23/00* (2006.01)
*H01L 21/683* (2006.01)

(52) U.S. Cl.
CPC ............................... *H01L 21/6833* (2013.01)

(58) Field of Classification Search
CPC ................................................... H01L 21/6833
USPC ............................................................ 361/234
See application file for complete search history.

(56) References Cited

U.S. PATENT DOCUMENTS

| | | | | |
|---|---|---|---|---|
| 4,502,094 A | * | 2/1985 | Lewin | ............... H01L 21/6831 118/500 |
| 7,544,251 B2 | * | 6/2009 | Holland | ........... H01L 21/67103 118/724 |
| 2011/0035937 A1 | | 2/2011 | Lu et al. | |
| 2013/0171336 A1 | | 7/2013 | Cheng et al. | |

* cited by examiner

*Primary Examiner* — Stephen W Jackson
(74) *Attorney, Agent, or Firm* — McClure, Qualey & Rodack, LLP

(57) ABSTRACT

A wafer chuck is provided. The wafer chuck includes a main body and a dielectric layer disposed over the main body. The wafer chuck also includes an electrode embedded in the dielectric layer and configured to generate an electrostatic field for retaining a wafer. The wafer chuck further includes a thermal conductive layer embedded in the main body or the dielectric layer. The thermal conductive layer has a lateral thermal conductivity greater than a vertical thermal conductivity.

20 Claims, 10 Drawing Sheets

WAFER CHUCK

BACKGROUND

Generally, electrostatic chucks may be used during the processing of semiconductor wafers in order to hold and transport semiconductor wafers and their carriers. Electrostatic chucks, as opposed to mechanical chucks that hold wafers by simply acting as a physical clamp, hold a wafer and carrier by supplying a charge to a plate and generating an electrostatic force to hold the semiconductor wafer. Such an arrangement allows the electrostatic chuck to avoid contact with the side of the wafer to be processed (a contact which is unavoidable with typical clamping mechanical chucks), thereby preventing damage from occurring on that side of the wafer.

However, the uniformity of temperature distribution at the wafer retained by the electrostatic chucks is required in an advanced semiconductor manufacturing process, such as a 28 nm technique or narrower. Although existing devices and methods to deliver wafers have been generally adequate for their intended purposes, they have not been entirely satisfactory in all respects. Consequently, it would be desirable to provide a solution for improving electrostatic chucks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
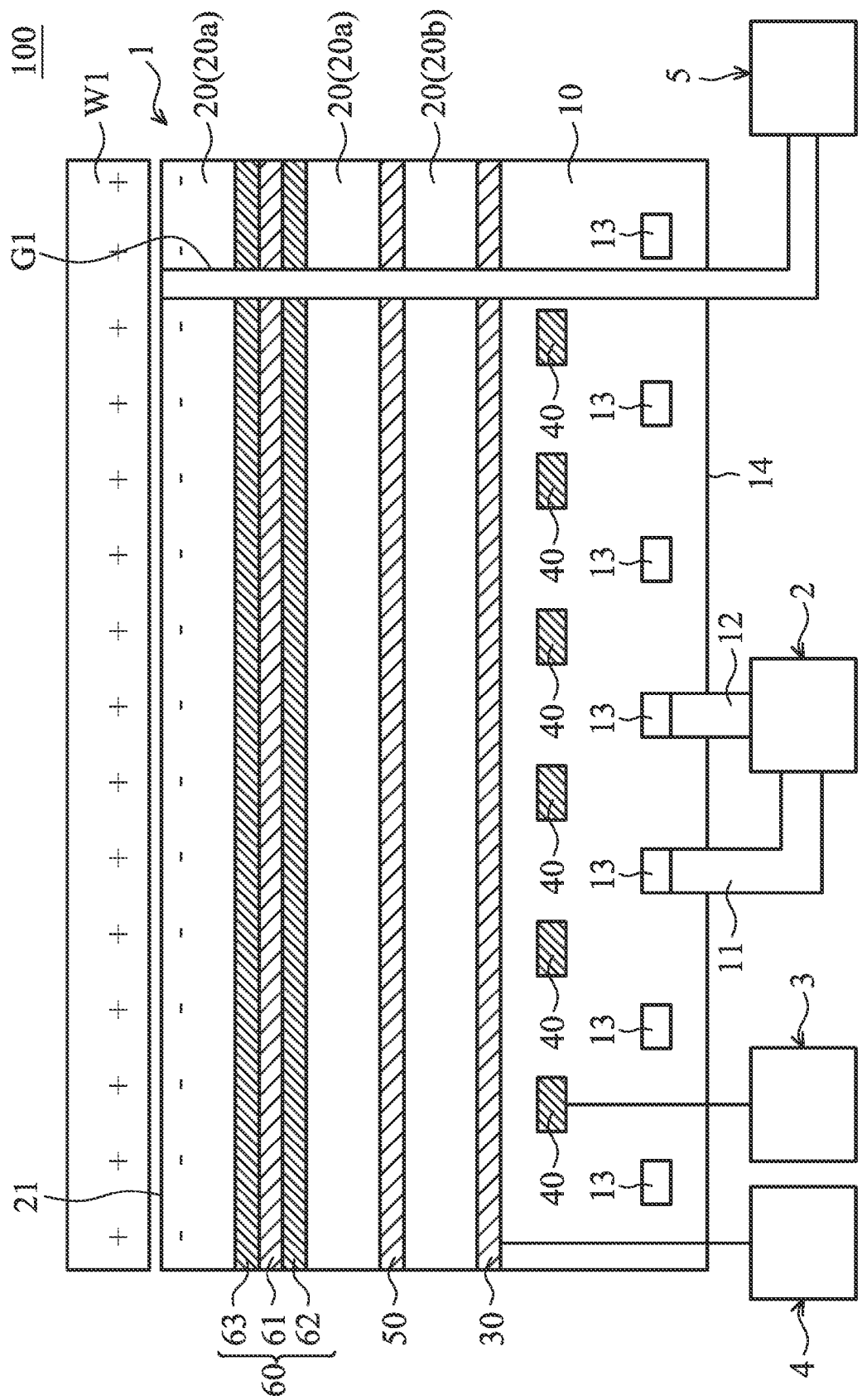
FIG. 1 is a schematic view of an electrostatic system in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

A wafer chuck is provided. The uniformity of the temperature distribution in each area of the wafer is improved during a semiconductor manufacturing process due to a thermal conductive material. In some embodiments, the semiconductor manufacturing process is a physical vapor deposition (PVD) process, a chemical vapor deposition (CVD) process, a doping process, an etching process, a photolithography process, or another suitable process.

FIG. 1 is a schematic view of an electrostatic system 100 in accordance with some embodiments of the disclosure. The electrostatic system 100 is applied to a semiconductor apparatus, such as a chemical mechanical polishing (CMP) apparatus, a physical vapor deposition (PVD) apparatus, a sputter apparatus, a thermal processing apparatus, an etching apparatus, a photolithography apparatus, or another suitable apparatus. The electrostatic system 100 includes a wafer chuck 1, a liquid controller 2, a heat controller 3, an electrostatic-field controller 4, and a gas controller 5.

The wafer chuck 1 is configured to support the wafer W1, and retains the wafer W1 in a fixed position. The wafer chuck 1 is also configured to adjust the temperature of the wafer W1. In some embodiments, the wafer chuck 1 is an electrostatic chuck.

The liquid controller 2 and the heat controller 3 are configured to control the temperature of the wafer chuck 1. The electrostatic-field controller 4 is configured to control the electrostatic-field generated by the wafer chuck 1. The gas controller 5 is configured to supply gas between the wafer W1 and the wafer chuck 1.

The wafer chuck 1 is a plate-like structure. In some embodiments, the wafer chuck 1 is a circular disk. The size of the wafer chuck 1 corresponds to, or is larger than, the size of the wafer W1. In some embodiments, the diameter of the wafer chuck 1 is greater than the diameter of the wafer W1. The thickness of wafer chuck 1 is in a range from about 1 cm to about 5 cm.

The wafer chuck 1 includes a main body 10, a dielectric layer 20, an adhesive layer 30, a heater 40, an electrode 50, and a thermal conductive layer 60. The main body 10 is configured to heat the wafer W1 or cool the wafer W1. The main body 10 is a plate-like structure. In some embodiments, the main body 10 is a circular disk. The main body 10 includes metal. In some embodiments, the main body 10 includes aluminum or ceramic.

The dielectric layer 20 is disposed over the main body 10. The adhesive layer 30 is between the main body 10 and the dielectric layer 20. The adhesive layer 30 is configured to bond the main body 10 and the dielectric layer 20.

As shown in FIG. 1, the dielectric layer 20 includes an upper dielectric layer 20a and a lower dielectric layer 20b. The upper dielectric layer 20a is disposed over the electrode 50. The lower dielectric layer 20b is disposed under the electrode 50. The thermal conductive layer 60 is embedded in the upper dielectric layer 20a.

The heater 40 is embedded in the main body 10. The heater 40 is configured to heat the main body 10. The electrode 50 is embedded in the dielectric layer 20. The electrode 50 is configured to generate an electrostatic field for retaining the wafer W1. In some embodiments, the thermal conductive layer 60 is embedded in the dielectric layer 20. The thermal conductive layer 60 is configured to provide a uniform temperature distribution in each area of the thermal conductive layer 60.

In some embodiments, as shown in FIG. 1, the thermal conductive layer 60 includes a thermal conductive material 61, a lower boundary material 62, and an upper boundary material 63. The thermal conductive material 61 is embedded in the dielectric layer 20. In some embodiments, the thermal conductive material 61 includes graphene or graphite. The thickness of the thermal conductive material 61 is in a range from about 1 um to about 50 um.

The lower boundary material 62 is configured to bond the thermal conductive material 61 and the dielectric layer 20. In some embodiments, the lower boundary material 62 includes metal, such as Cu or Ni. The thickness of the lower boundary material 62 is in a range from about 1 um to about 50 um. In some embodiments, the lower boundary material 62 is bonded to the thermal conductive material 61 by electroplating or bounding. In some embodiments, the dielectric layer 20 includes ceramic. The dielectric layer 20 is bonded to the lower boundary material 62 by sintering or spraying.

The upper boundary material 63 is configured to bond the thermal conductive material 61 and the dielectric layer 20. In some embodiments, the upper boundary material 63 includes metal, such as Cu or Ni. The thickness of the upper boundary material 63 is in a range from about 1 um to about 50 um. In some embodiments, the upper boundary material 63 is bonded to the thermal conductive material 61 by electroplating or bounding. In some embodiments, the dielectric layer 20 includes ceramic. The dielectric layer 20 is bonded to the upper boundary material 63 by sintering or spraying.

Figure 2:
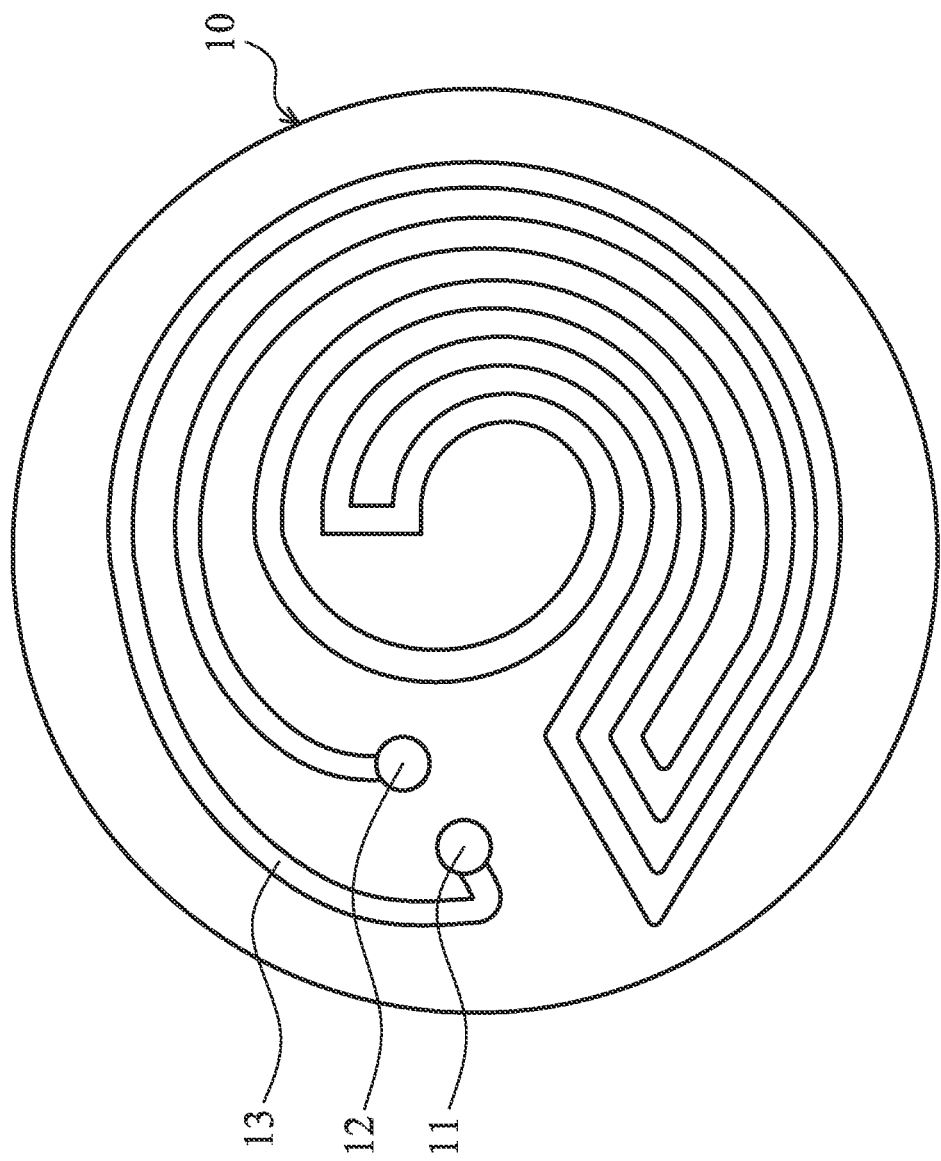
FIG. 2 is a schematic view of a main body and a liquid channel in accordance with some embodiments of the disclosure.

FIG. 2 is a schematic view of the main body 10 and the liquid channel 13 in accordance with some embodiments of the disclosure. As shown in FIGS. 1 and 2, the main body 10 includes an inlet 11, an outlet 12, and a liquid channel 13. In some embodiments, the inlet 11 and the outlet 12 are located close to the bottom surface 14 of the main body 10. In some embodiments, the inlet 11 and the outlet 12 are close to the edge of the main body 10. The inlet 11 is close to the outlet 12. The liquid channel 13 is formed inside of the main body 10. Two ends of the liquid channel 13 are respectively connected at the inlet 11 and the outlet 12.

In some embodiments, the liquid channel 13 extends along a spiral path as shown in FIG. 2. The liquid channel 13 has various patterns according to different designs, and thus the pattern of the liquid channel 13 should not be limited to the described disclosure. The liquid channel 13 is substantially uniformly distributed at a cross section of the main body 10. In some embodiments, the cross section is substantially parallel to the wafer W1. In some embodiments, the cross section is substantially parallel to a horizontal plane. The liquid channel 13 is extended from the inlet 11 close to the edge of the cross section toward the center portion of the cross section. Moreover, the liquid channel 13 is extended from the center portion of the cross section toward the outlet 12 close to the edge of the cross section.

The liquid controller 2 supplies a liquid flowing through the liquid channel 13 to adjust the temperature of the main body 10. The liquid flows into the liquid channel 13 via the inlet 11, and flows back to the liquid controller 2 via the outlet 12. In some embodiments, the liquid is water or coolant.

In some embodiments, the liquid controller 2 controls the flow rate of the liquid flowing through the liquid channel 13. Therefore, the liquid controller 2 can control the rate of temperature decrease of the main body 10 by changing the flow rate of the liquid.

In some embodiments, the liquid controller 2 controls the temperature of the liquid flowing into the liquid channel 13. The liquid controller 2 decreases the temperature of the main body 10 by supplying liquid with a temperature lower than that of the main body 10.

For example, the liquid flowing into the liquid channel 13 has a temperature in a range from about $-10°$ C. to about $20°$ C. The main body 10 has a temperature in a range from about $-10°$ C. to about $120°$ C. when a semiconductor manufacturing process is performed on the wafer W1. The temperature of the main body 10 is greater then the liquid. The liquid absorbs the heat of the main body 10. Therefore, when the liquid flows through the liquid channel 13, the temperature of the main body 10 is decreased.

By the positions of the inlet 11 and the outlet 12 and the distribution of the liquid channel 13, the temperature distribution of the cross section of the main body 10 is substantially uniform. However, the temperature of an area of the cross section that the liquid flows through and the temperature of an area of the cross section that the liquid does not flow through are actually different. In addition, the temperate of the liquid near the inlet 11 is lower than the temperature of the liquid near the outlet 12. Therefore, the temptations of the cross section at the area near the inlet 11 and the area near the outlet 12 has a great temperature difference. As a result, the temperature distribution of the cross section is not uniform enough.

Figure 3:
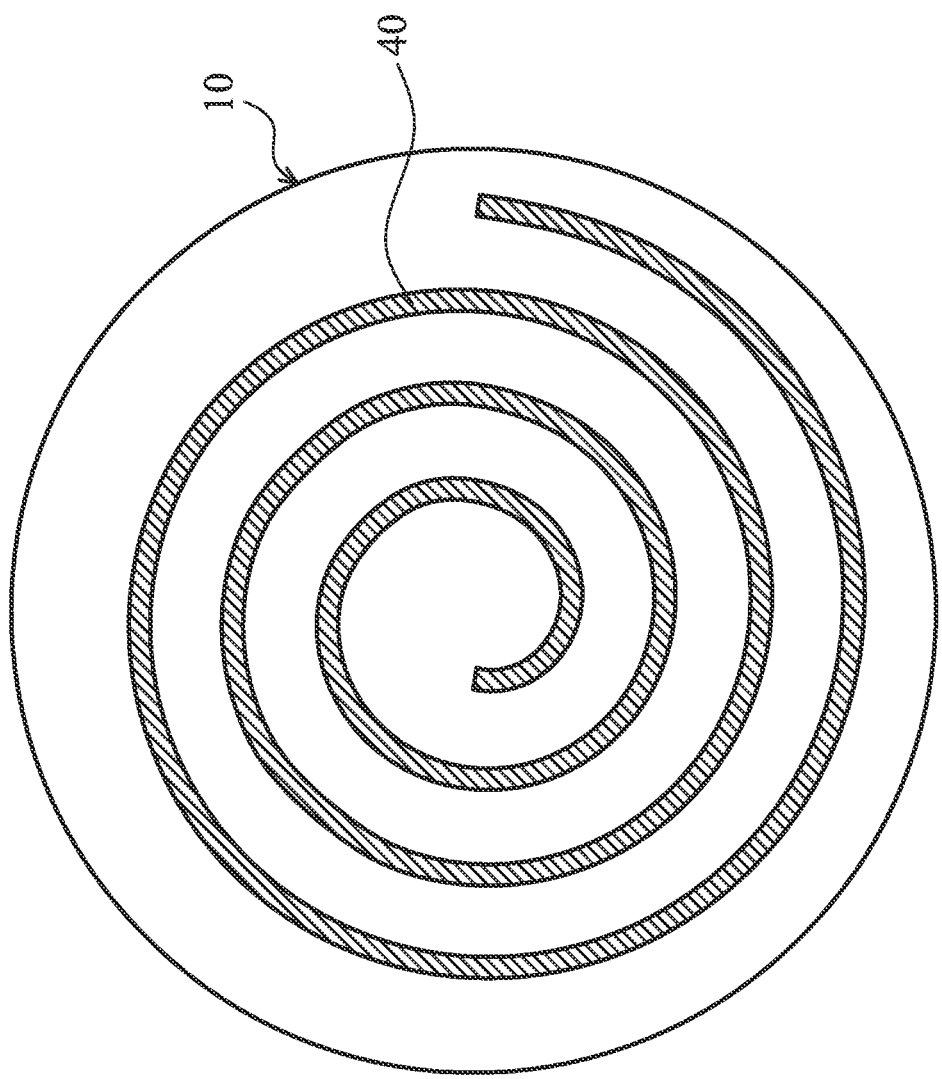
FIG. 3 is a schematic view of the main body and a heater in accordance with some embodiments of the disclosure.

FIG. 3 is a schematic view of the main body 10 and the heater 40 in accordance with some embodiments of the disclosure. As shown in FIGS. 1 and 3, the heater 40 is embedded in the main body 10. In some embodiments, the heater 40 is between the top surface of the main body 10 and the liquid channel 13. The heat controller 3 is electrically connected to the heater 40. The heat controller 3 increases the temperature of the heater 40 by supplying current to the heater 40.

In some embodiments, the heater 40 is a heating wire. In some embodiments, the heater 40 extends along a spiral path as shown in FIG. 3. The heater 40 is substantially uniformly distributed at a cross section of the main body 10. In some embodiments, the cross section is substantially parallel to the wafer W1. In some embodiments, the cross section is substantially parallel to a horizontal plane. The heater 40 has various patterns according to different designs, and thus the pattern of the heater 40 should not be limited to the described disclosure. The liquid channel 13 is extended from the edge of the cross section toward the center portion of the cross section.

By the distribution of the heater 40, the temperature distribution of the cross section of the main body 10 is substantially uniform. However, the temperature of an area of the cross section adjacent to the heater 40 and the temperature of an area of the cross section that is distant from the heater 40 are actually different. As a result, the temperature distribution at the cross section of the heater 40 is not uniform enough.

In some embodiments, the heater 40 or the liquid channel 13 is alternately excluded from the wafer chuck 1.

As shown in FIG. 1, the dielectric layer 20 is disposed over the main body 10. The dielectric layer 20 has an upper surface 21. The dielectric layer 20 is configured to support the wafer W1 on the upper surface 21. In some embodiments, the area of an upper surface 21 of the dielectric layer 20 corresponds to, or is larger than, the wafer W1. In some embodiments, the diameter of the upper surface 21 is greater than the diameter of the wafer W1. In some embodiments, the upper surface 21 is substantially parallel to the wafer W1. In some embodiments, the upper surface 21 is substantially parallel to a horizontal plane. The dielectric layer 20 is a plate-like structure. In some embodiments, the dielectric layer 20 is a circular disk.

In some embodiments, the dielectric layer 20 includes ceramic. In some embodiments, the dielectric layer 20 is made of ceramic and the main body 10 is made of metal, for example. The adhesive layer 30 is used to bond the main body 10 and the dielectric layer 20.

The electrode 50 is embedded in the dielectric layer 20. The electrode 50 is configured to generate an electrostatic field for retaining the wafer W1. The electrode 50 is an electrical conductor. In some embodiments, the electrode 50 includes metal. The electrode 50 is a plate-like structure. In some embodiments, the electrode 50 is substantially parallel to the wafer W1. In some embodiments, the electrode 50 is substantially parallel to a horizontal plane.

In some embodiments, the electrode 50 and the main body 10 are electrical conductors. The dielectric layer 20 is an insulator. The electrode 50 is separated from the main body 10 by the dielectric layer 20. Therefore, the electrode 50 is isolated from the main body 10 since the dielectric layer 20 is an insulator.

The electrostatic-field controller 4 is electrically connected to the electrode 50. The electrostatic-field controller 4 provides a voltage to the electrode 50 to make the electrode 50 generate an electrostatic field.

When a semiconductor manufacturing process is processed, the wafer W1 is disposed on an upper surface 21 of the dielectric layer 20. When the electrostatic field is generated by the electrode 50, an electrostatic force is generated between the wafer W1 and the dielectric layer 20. Therefore, the wafer W1 is retained by the wafer chuck 1.

The wafer chuck 1 further includes a gas channel G1. In some embodiments, the gas channel G1 passes through the wafer chuck 1 from the upper surface 21 to the bottom surface 14. In other words, the gas channel G1 passes through the main body 10, the dielectric layer 20, and the adhesive layer 30. The gas controller 5 is in communication with the gas channel G1. The gas controller 5 supplies a gas to the gas channel G1. The gas is exhausted from the upper surface 21 via the gas channel G1. In some embodiments, the gas is an inert gas, such as helium.

When the heater 40 generates heat, the heater 40 heats the main body 10. Afterward, the heat is transmitted to the upper surface 21 of the dielectric layer 20. However, in general, some tiny gaps are between some areas of the wafer W1 and the upper surface 21, since the wafer W1 or the upper surface 21 is not perfectly flat. The gas is configured to fill the tiny gaps. Therefore, the heat can be transmitted from the upper surface 21 to the wafer W1 via the gas in the tiny gaps when the wafer W1 and the wafer chuck 1 are located in a vacuum environment.

In some embodiments, the thermal conductive layer 60 is embedded in the dielectric layer 20 between the upper surface 21 and the electrode 50. In some embodiments, the thermal conductive layer 60 is substantially parallel to the wafer W1. In some embodiments, the thermal conductive layer 60 is substantially parallel to a horizontal plane. In some embodiments, the thickness of the thermal conductive layer 60 is in a range from about 1 um to about 50 um, or from about 6 um to about 20 um.

In some embodiments, the thermal conductive layer 60 is located away from the upper surface 21 by a distance in a range from about 0.05 cm to about 0.1 cm. The thermal conductive layer 60 is located away from the electrode 50 by a distance in a range from about 0.05 cm to about 0.1 cm. The area of the thermal conductive layer 60 corresponds to, or is larger than, the area of the wafer W1.

The thermal conductive layer 60 includes graphene or graphite. The thermal conductive layer 60 has a lateral thermal conductivity (i.e., a thermal conductivity along a horizontal plane) and a vertical thermal conductivity (i.e., a thermal conductivity perpendicular to a horizontal plane). In some embodiments, the lateral thermal conductivity is in a range from about 100 times to 200 times greater than the vertical thermal conductivity. Alternatively, the lateral thermal conductivity is 100 times, 130 times or 160 times greater than the vertical thermal conductivity.

As described, the temperature distribution at the cross section of the main body 10 passing through the heater 40 or the liquid channel 13 is not uniform enough. That may cause the temperature distribution of the wafer W1 to not comply with an advanced semiconductor manufacturing process, such as a 28 nm semiconductor manufacturing process or narrower if the wafer chuck 1 excludes the thermal conductive layer 60. Accordingly, the thermal conductive layer 60 is utilized to equalize the temperature distribution of the wafer W1.

In some embodiments, when the heat is transmitted from the heater 40 to the thermal conductive layer 60, the heat at the thermal conductive layer 60 is uniform since the lateral thermal conductivity of the thermal conductive layer 60 is greater than the vertical thermal conductivity of the thermal conductive layer 60. Afterward, the heat equalized by the thermal conductive layer 60 is transmitted to the wafer W1, and the wafer W1 is heated by uniform heat.

Accordingly, when the heat is transmitted from the upper surface 21 of the dielectric layer 20 to the thermal conductive layer 60 due to the cold of the main body 10, the heat at the thermal conductive layer 60 is also equalized. Therefore, the heat of wafer W1 is absorbed uniformly.

As a result, the temperature distribution in each area of the wafer W1 is uniform due to the thermal conductive layer 60, and it complies with the requirements of a semiconductor manufacturing process. For example, one requirement may be that the temperature difference between the highest temperature and the lowest temperature of the wafer W1 is less than 0.1 degrees.

Figure 4A:
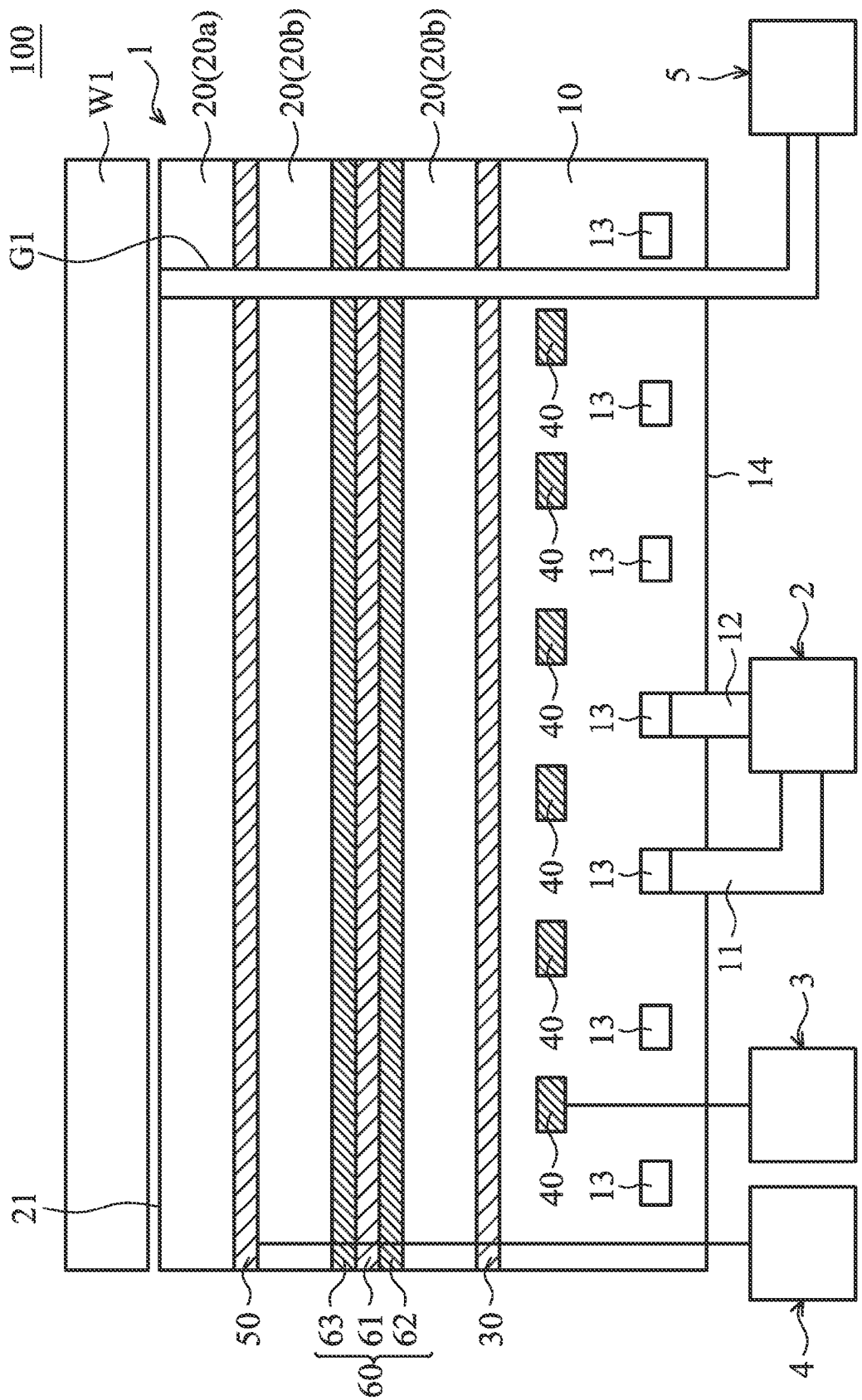
FIGS. 4A to 4B are schematic views of electrostatic systems in accordance with some embodiments of the disclosure.

FIG. 4A is a schematic view of an electrostatic system 100 in accordance with some embodiments of the disclosure. In some embodiments, the thermal conductive layer 60 is between the electrode 50 and the main body 10. In other words, the thermal conductive layer 60 is embedded in the lower dielectric layer 20b. The electrostatic field influenced by the thermal conductive layer 60 is decreased further. In some embodiments, the thermal conductive layer 60 is located away from a lower surface opposite to the upper surface 21 of the dielectric layer 20 by a distance in a range from about 0.05 cm to about 0.1 cm. The thermal conductive layer 60 is located away from the electrode 50 by a distance in a range from about 0.05 cm to about 0.1 cm.

Figure 4B:
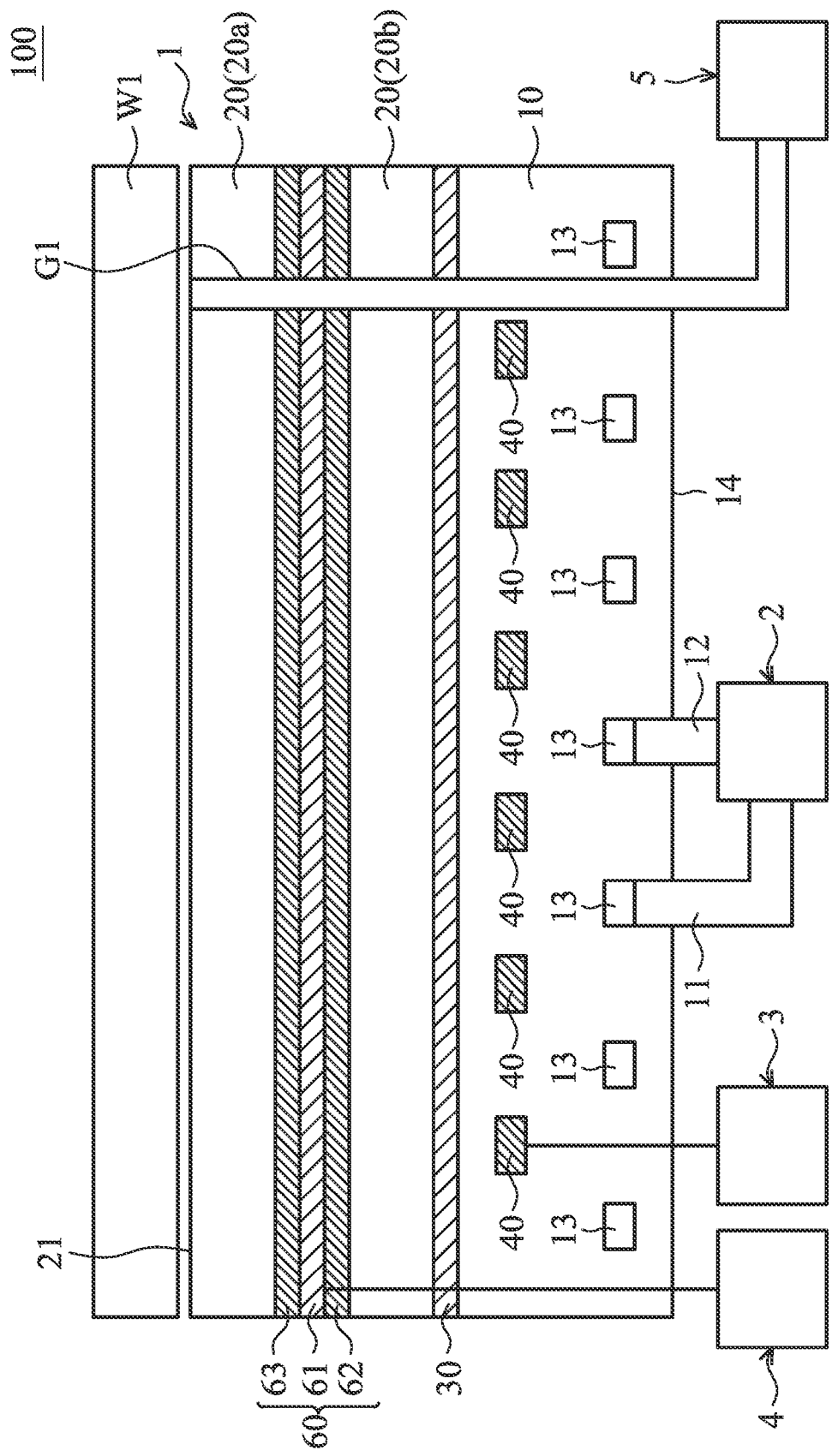

FIG. 4B is a schematic view of an electrostatic system 100 in accordance with some embodiments of the disclosure. In some embodiments, the electrode 50 in FIG. 1 is excluded from the wafer chuck 1, and replaced by the thermal conductive layer 60. The thermal conductive layer 60 further includes the function of the electrode 50. The electrostatic-field controller 4 is electrically connected to the thermal conductive layer 60. Therefore, the thermal conductive layer 60 is also configured to generate an electrostatic field. As a result, the thickness of the wafer chuck 1 can be further reduced.

In some embodiments, the thermal conductive layer 60 is located away the upper surface 21 by a distance in a range from about 0.05 cm to about 0.1 cm. The thermal conductive layer 60 is located away from a lower surface opposite to the upper surface 21 of the dielectric layer 20 by a distance in a range from about 0.01 cm to about 0.05 cm.

Figure 5:
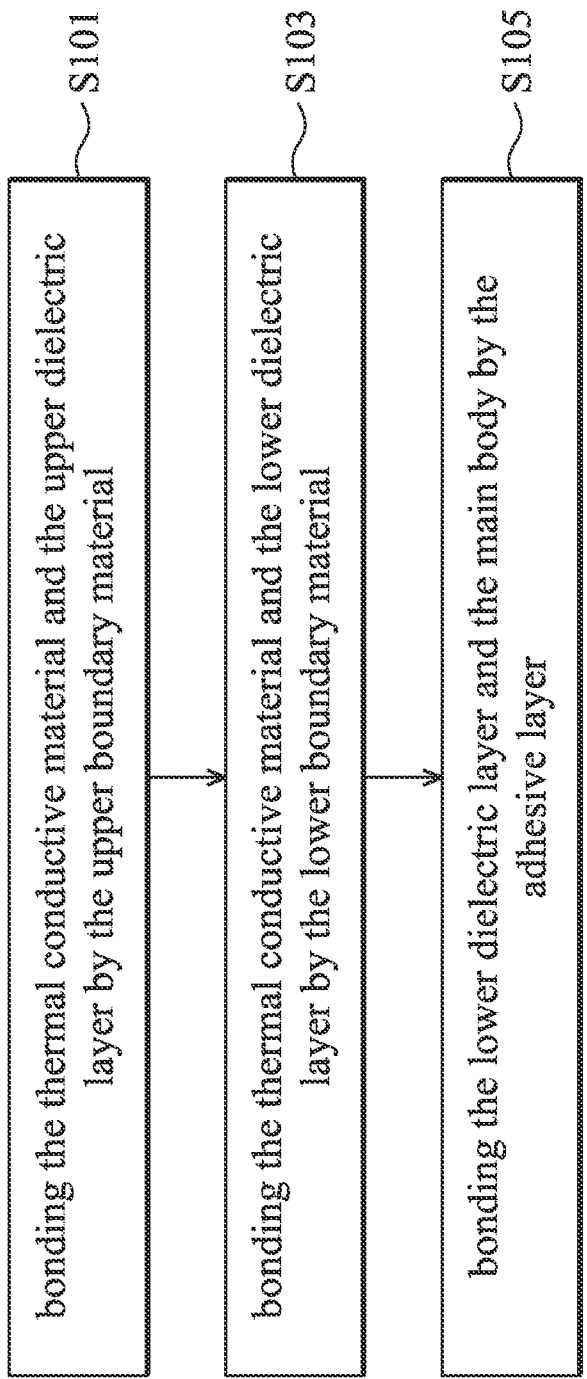
FIG. 5 is a flow chart of a manufacturing method of the electrostatic chuck in accordance with some embodiments of the disclosure.

FIG. 5 is a flow chart of a manufacturing method of the electrostatic system 100 in accordance with some embodiments of the disclosure. In step S101, the thermal conductive material 61 and the upper dielectric layer 20a are bonded by the upper boundary material 63. In some embodiments, the upper boundary material 63 is bonded to the thermal conductive material 61 by electroplating or bounding. Afterward, the upper dielectric layer 20a is bonded to the upper boundary material 63 by sintering or spraying.

In step S103, the thermal conductive material 61 and the lower dielectric layer 20b are bonded by the lower boundary material 62. In some embodiments, the lower boundary material 62 is bonded to the thermal conductive material 61 by electroplating or bounding. Afterward, the lower dielectric layer 20b is bonded to the lower boundary material 62 by sintering or spraying.

In some embodiments, the electrode 50 is embedded in the upper dielectric layer 20a or the lower dielectric layer 20b. In some embodiments, the electrode 50 is excluded in the wafer chuck 1.

In step S105, the lower dielectric layer 20b and the main body 10 are bonded by the adhesive layer 30. In some embodiments, the liquid channel 13, the gas channel G1, and/or the heater 40 are formed or embedded in the main body 10.

Figure 6:
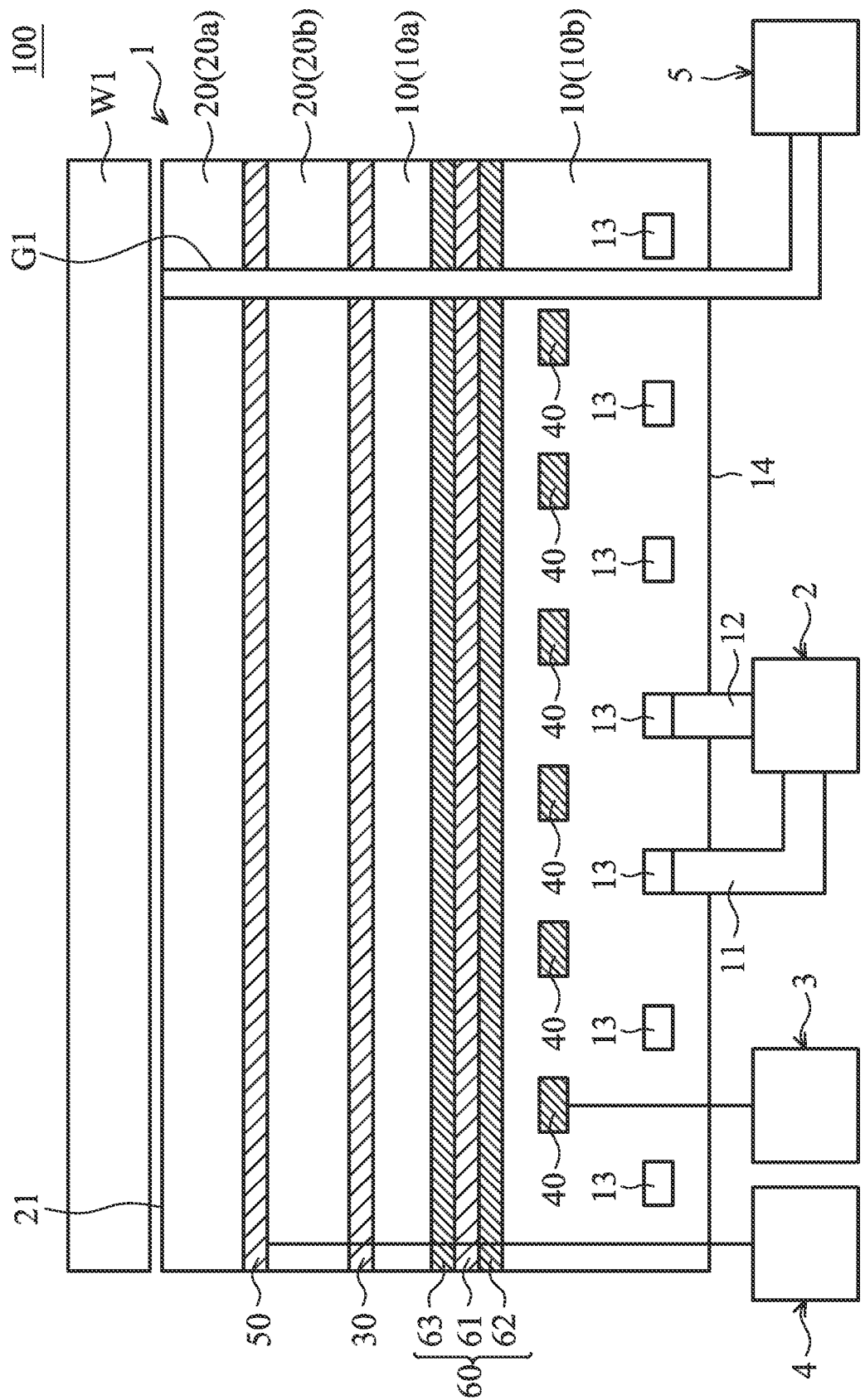
FIG. 6 is a schematic view of an electrostatic system in accordance with some embodiments of the disclosure.

FIG. 6 is a schematic view of an electrostatic system 100 in accordance with some embodiments of the disclosure. In some embodiments, the thermal conductive layer 60 is embedded in the main body 10. The thermal conductive layer 60 is between the dielectric layer 20 and the heater 40. In some embodiments, the thermal conductive layer 60 is between the dielectric layer 20 and the liquid channel 13.

In some embodiments, the thermal conductive layer 60 is located away from the bottom surface 14 by a distance in a range from about 0.5 cm to about 3 cm. The thermal conductive layer 60 is located away from a top surface opposite to the bottom surface 14 of the main body 10 by a distance in a range from about 0.05 cm to about 0.2 cm. As a result, the electrostatic field influenced by the thermal conductive layer 60 is decreased further.

Figure 7:
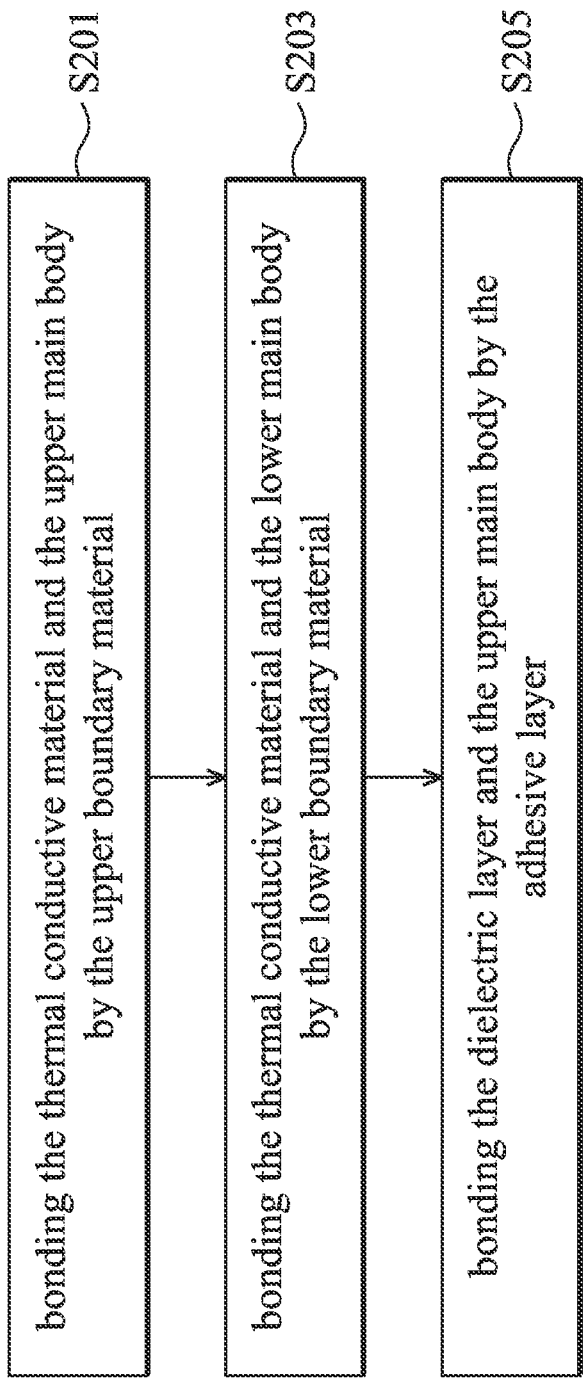
FIG. 7 is a flow chart of a manufacturing method of the electrostatic chuck in accordance with some embodiments of the disclosure.

FIG. 7 is a flow chart of a manufacturing method of the electrostatic system 100 in accordance with some embodiments of the disclosure. In some embodiments, the main body 10 includes an upper main body 10a and a lower main body 10b. In some embodiments, the liquid channel 13, the gas channel G1, and/or the heater 40 are formed or embedded in the lower main body 10b. The thermal conductive material 61 includes graphene. The thermal conductive material 61 is embedded in the lower main body 10b.

In step S201, the thermal conductive material 61 and the upper main body 10a are bonded by the upper boundary material 63. In others words, the upper boundary material 63 is configured to bond the thermal conductive material 61 and the upper main body 10a. In some embodiments, the upper boundary material 63 is bonded to the thermal conductive material 61 by electroplating or bounding. Afterward, the upper main body 10a is boned to the upper boundary material 63 by sintering.

In step S203, the thermal conductive material 61 and the lower main body 10b are bonded by the lower boundary material 62. In others words, the lower boundary material 62 is configured to bond the thermal conductive material 61 and the lower main body 10b. In some embodiments, the lower boundary material 62 is bonded to the thermal conductive material 61 by electroplating or bounding. Afterward, the lower main body 10b is boned to the lower boundary material 62 by sintering.

In step S205, the dielectric layer 20 and the upper main body 10a are bonded by the adhesive layer 30. In some embodiments, the electrode 50 and/or the gas channel G1 are embedded or formed in the dielectric layer 20.

Figure 8:
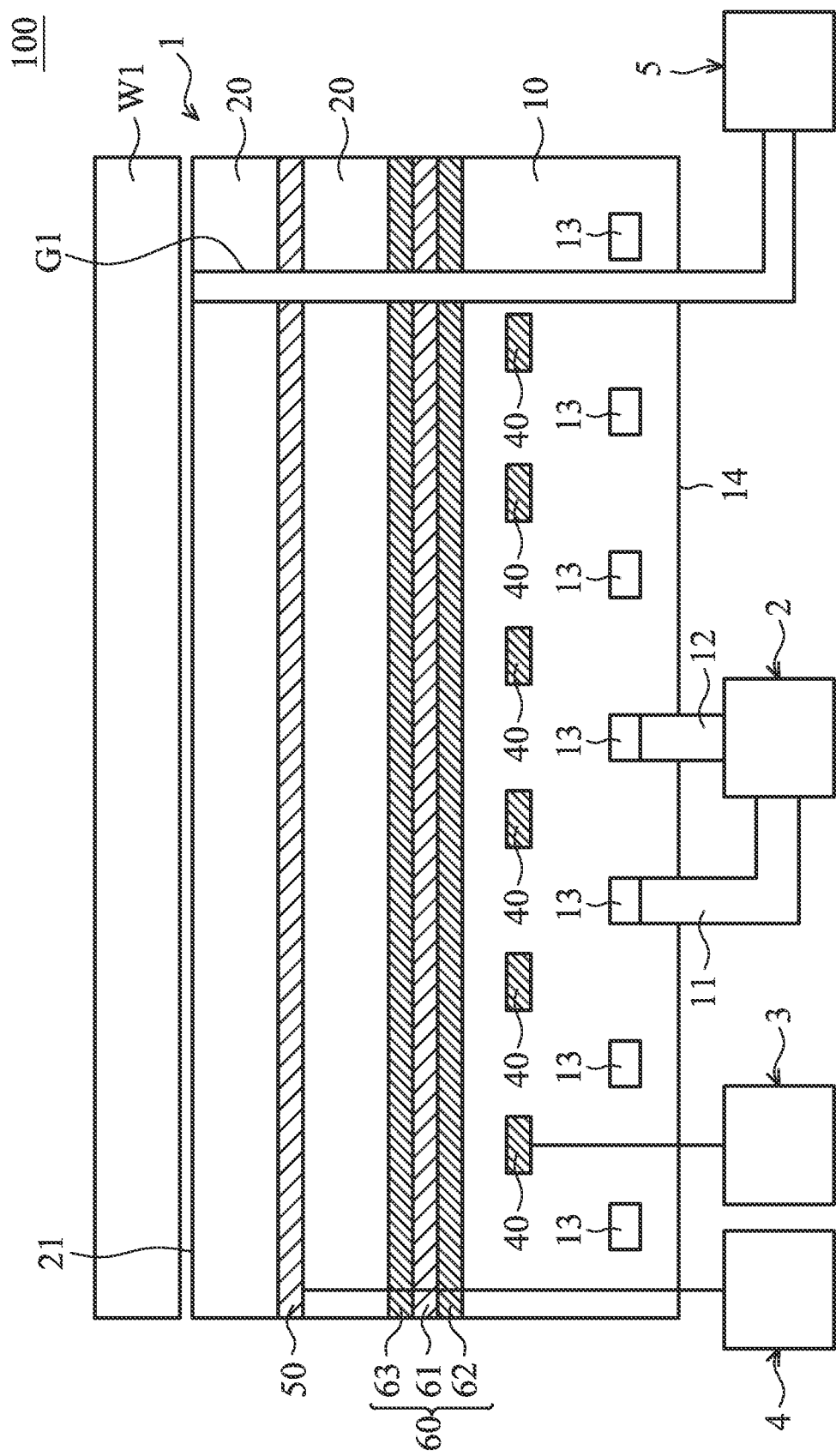
FIG. 8 is a schematic view of an electrostatic system in accordance with some embodiments of the disclosure.

FIG. 8 is a schematic view of an electrostatic system 100 in accordance with some embodiments of the disclosure. In some embodiments, the adhesive layer 30 in FIG. 1 is excluded from the wafer chuck 1, and replaced by the thermal conductive layer 60. The thermal conductive layer 60 further includes the function of the adhesive layer 30. The thermal conductive layer 60 is between the main body 10 and the dielectric layer 20. The thermal conductive layer 60 is configured to bond the main body 10 and the dielectric layer 20. As a result, the thickness of the wafer chuck 1 can be further reduced.

In some embodiments, the thermal conductive material 61 includes graphene. The thermal conductive material 61 is between the main body 10 and the dielectric layer 20. The lower boundary material 62 is configured to bond the thermal conductive material 61 and the main body 10. The upper boundary material 63 is configured to bond the thermal conductive material 61 and the dielectric layer 20.

Figure 9:
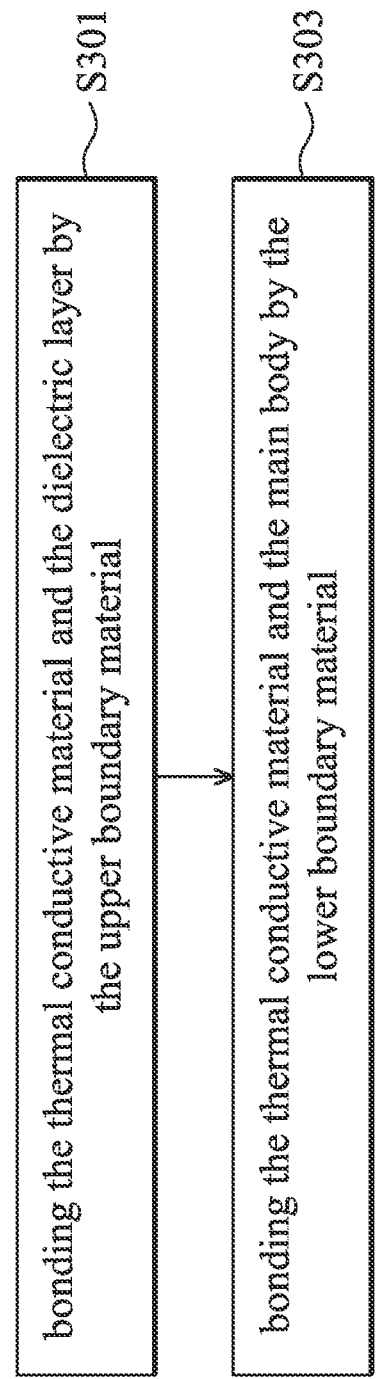
FIG. 9 is a flow chart of a manufacturing method of the electrostatic chuck in accordance with some embodiments of the disclosure.

FIG. 9 is a flow chart of a manufacturing method of the electrostatic system 100 in accordance with some embodiments of the disclosure. In step S301, the thermal conductive material 61 and the dielectric layer 20 are bonded by the upper boundary material 63. In some embodiments, the upper boundary material 63 is bonded to the thermal conductive material 61 by electroplating or bounding. Afterward, the dielectric layer 20 is bonded to the upper boundary material 63 by sintering or spraying.

In step S303, the thermal conductive material 61 and the main body 10 are bonded by the lower boundary material 62. In some embodiments, the lower boundary material 62 is bonded to the thermal conductive material 61 by electroplating or bounding. Afterward, the main body 10 is bonded to the lower boundary material 62 by sintering.

Embodiments of wafer chucks are provided. When a heat is transmitted from a heater to a thermal conductive layer of a wafer chuck, the heat at the thermal conductive layer is uniform since the lateral thermal conductivity of the thermal conductive layer is greater than the vertical thermal conductivity of the thermal conductive layer. Accordingly, when the heat is transmitted from an upper surface of a dielectric layer to the thermal conductive layer since the main body is cooled, the heat at the thermal conductive layer is also uniformed. As a result, the uniformity of the temperature distribution in each area of the wafer is improved due to the thermal conductive material during semiconductor manufacturing process.

In some embodiments, a wafer chuck is provided. The wafer chuck includes a main body and a dielectric layer disposed over the main body. The wafer chuck also includes an electrode embedded in the dielectric layer and configured to generate an electrostatic field for retaining a wafer. The wafer chuck further includes a thermal conductive layer embedded in the main body or the dielectric layer. The thermal conductive layer has a lateral thermal conductivity and a vertical thermal conductivity. The lateral thermal conductivity is greater than the vertical thermal conductivity.

In some embodiments, a wafer chuck is provided. The wafer chuck includes a main body and a dielectric layer disposed over the main body. The wafer chuck also includes a thermal conductive layer embedded in the dielectric layer. The thermal conductive layer is configured to generate an electrostatic field for retaining a wafer. The thermal conductive layer has a lateral thermal conductivity and a vertical thermal conductivity. The lateral thermal conductivity is greater than the vertical thermal conductivity.

In some embodiments, a wafer chuck is provided. The wafer chuck includes a main body and a dielectric layer disposed over the main body. The wafer chuck also includes an electrode embedded in the dielectric layer and configured to generate an electrostatic field for retaining a wafer. The wafer chuck further includes a thermal conductive layer between the main body and the dielectric layer, configured to bond the main body and the dielectric layer. The thermal conductive layer has a lateral thermal conductivity and a vertical thermal conductivity. The lateral thermal conductivity is greater than the vertical thermal conductivity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer chuck, comprising:
   a main body;
   a dielectric layer disposed over the main body;
   an electrode, embedded in the dielectric layer, configured to generate an electrostatic field for retaining a wafer; and
   a thermal conductive layer embedded in the main body or the dielectric layer and located away from an interface of the main body and the dielectric layer,
   wherein the thermal conductive layer has a lateral thermal conductivity and a vertical thermal conductivity, and the lateral thermal conductivity is greater than the vertical thermal conductivity.

2. The wafer chuck as claimed in claim 1, wherein the thermal conductive layer comprises graphene.

3. The wafer chuck as claimed in claim 1, wherein the lateral thermal conductivity is in a range from about 100 times to 200 times greater than the vertical thermal conductivity.

4. The wafer chuck as claimed in claim 1, wherein the dielectric layer has an upper surface, the thermal conductive layer is between the upper surface and the electrode when the thermal conductive layer is embedded in the dielectric body.

5. The wafer chuck as claimed in claim 1, wherein the thermal conductive layer is between the electrode and the main body when the thermal conductive layer is embedded in the dielectric body.

6. The wafer chuck as claimed in claim 1, wherein when the thermal conductive layer is embedded in the dielectric layer, the thermal conductive layer comprises:
   a thermal conductive material embedded in the dielectric layer; and
   a boundary material configured to bond the thermal conductive material and the dielectric layer,
   wherein the thermal conductive material comprises graphene, and the boundary material comprises metal.

7. The wafer chuck as claimed in claim 1, wherein when the thermal conductive layer is embedded in the main body, the thermal conductive layer comprises:
   a thermal conductive material embedded in the main body; and
   a boundary material configured to bond the thermal conductive material and the main body,
   wherein the thermal conductive material comprises graphene, and the boundary material comprises metal.

8. The wafer chuck as claimed in claim 1, further comprising a heater, embedded in the main body, configured to heat the main body, wherein the thermal conductive layer is between the dielectric layer and the heater when the thermal conductive layer is embedded in the main body.

9. The wafer chuck as claimed in claim 1, wherein the main body comprises a liquid channel, and the thermal conductive layer is between the dielectric layer and the liquid channel when the thermal conductive layer is embedded in the main body.

10. A wafer chuck, comprising:
    a main body;
    a dielectric layer disposed over the main body; and
    a thermal conductive layer embedded in the dielectric layer and located away from an interface of the main body and the dielectric layer;
    wherein the thermal conductive layer is configured to generate an electrostatic field for retaining a wafer,
    wherein the thermal conductive layer has a lateral thermal conductivity and a vertical thermal conductivity, and the lateral thermal conductivity is greater than the vertical thermal conductivity.

11. The wafer chuck as claimed in claim 10, wherein the thermal conductive layer comprises graphene.

12. The wafer chuck as claimed in claim 10, wherein the lateral thermal conductivity is in a range from about 100 times to 200 times greater than the vertical thermal conductivity.

13. The wafer chuck as claimed in claim 10, wherein the thermal conductive layer comprises:

a thermal conductive material embedded in the dielectric layer; and a boundary material configured to bond the thermal conductive material and the dielectric layer, wherein the thermal conductive material comprises graphene, and the boundary material comprises metal.

14. The wafer chuck as claimed in claim 10, further comprising a heater, embedded in the main body, configured to heat the main body.

15. The wafer chuck as claimed in claim 10, wherein the main body comprises a liquid channel, for a liquid flowing therethrough, and the liquid is configured to adjust a temperature of the main body.

16. A wafer chuck, comprising:

a main body comprising a liquid channel;

a dielectric layer disposed over the main body;

an electrode, embedded in the dielectric layer, configured to generate an electrostatic field for retaining a wafer; and a thermal conductive layer between the main body and the dielectric layer and located away from the liquid channel, wherein the thermal conductive layer has a lateral thermal conductivity and a vertical thermal conductivity, and the lateral thermal conductivity is greater than the vertical thermal conductivity.

17. The wafer chuck as claimed in claim 16, wherein the thermal conductive layer comprises graphene, and the lateral thermal conductivity is in a range from about 100 times to 200 times greater than the vertical thermal conductivity.

18. The wafer chuck as claimed in claim 16, wherein the thermal conductive layer comprises:

a thermal conductive material between the main body and the dielectric layer;

an upper boundary material configured to bond the thermal conductive material and the dielectric layer; and a lower boundary material configured to bond the thermal conductive material and the main body, wherein the thermal conductive material comprises graphene, and the upper and lower boundary materials comprise metal.

19. The wafer chuck as claimed in claim 16, further comprising a heater, embedded in the main body, configured to heat the main body.

20. The wafer chuck as claimed in claim 16, wherein the liquid channel facilitates for a liquid flowing therethrough, and the liquid is configured to adjust a temperature of the main body.

* * * * *